US012597857B2

(12) United States Patent
Wu et al.

(10) Patent No.: US 12,597,857 B2
(45) Date of Patent: Apr. 7, 2026

(54) ADAPTIVE CHARGE PUMP VOLTAGE SUPPLY FREQUENCY SWITCH

(71) Applicant: pSemi Corporation, San Diego, CA (US)

(72) Inventors: Gary Chunshien Wu, San Diego, CA (US); Gregory Szczeszynski, Nashua, NH (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 18/664,665

(22) Filed: May 15, 2024

(65) Prior Publication Data

US 2024/0396444 A1 Nov. 28, 2024

Related U.S. Application Data

(60) Provisional application No. 63/504,333, filed on May 25, 2023.

(51) Int. Cl.
*H02M 3/07* (2006.01)
*H03K 3/03* (2006.01)

(52) U.S. Cl.
CPC ............ *H02M 3/07* (2013.01); *H03K 3/0315* (2013.01)

(58) Field of Classification Search
CPC ....................................................... H02M 3/07
USPC .......................................................... 327/536
See application file for complete search history.

(56) References Cited

U.S. PATENT DOCUMENTS

2014/0035661 A1* 2/2014 Myers ..................... H02M 3/07
327/536

* cited by examiner

*Primary Examiner* — Tomi Skibinski
(74) *Attorney, Agent, or Firm* — Haynes and Boone, LLP

(57) ABSTRACT

Circuits and methods that enable a charge pump to provide sufficient charge to the gate of a switch NFET to turn the NFET ON within a specified switching time requirement but with minimal generation of electronic noise. An embodiment includes a dual-oscillator circuit configured to output from a first oscillator a first frequency signal from a first oscillator during normal operation, and to output from a second oscillator a second frequency signal higher in frequency than the first frequency signal for a selected time determined by a counter. An embodiment includes a charge pump coupled to the dual-oscillator circuit and configured to output an electrical charge as a function of an applied frequency signal from the dual-oscillator circuit, wherein application of the second frequency signal output during counting increases the amount of electrical charge output by the charge pump.

22 Claims, 5 Drawing Sheets

*100*

200

_500_

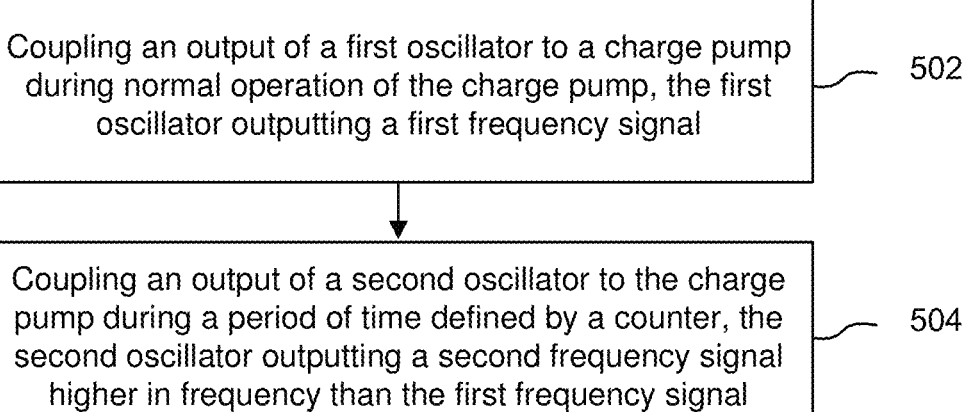

Coupling an output of a first oscillator to a charge pump during normal operation of the charge pump, the first oscillator outputting a first frequency signal ⟋— 502

Coupling an output of a second oscillator to the charge pump during a period of time defined by a counter, the second oscillator outputting a second frequency signal higher in frequency than the first frequency signal ⟋— 504

FIG. 5

ADAPTIVE CHARGE PUMP VOLTAGE SUPPLY FREQUENCY SWITCH

CROSS-REFERENCE TO RELATED APPLICATIONS-CLAIM OF PRIORITY

The present application claims priority to the following patent application, assigned to the assignee of the present invention, the contents of which are incorporated by reference: U.S. Provisional Patent Application Ser. No. 63/504, 333, filed May 25, 2023, entitled "*Adaptive Charge Pump Voltage Supply Frequency Switch*".

BACKGROUND

(1) Technical Field

This invention relates to electronic circuits, and more particularly to voltage supplies for power converters, particularly charge pumps.

(2) Background

An electronic switch, such as a single-pole, double-throw (SPDT) switch configuration, may use N-type MOSFETs (NFETs) to pass or block a DC voltage from a selected source. Turning NFETs ON to a conductive state generally requires a power converter, such as a capacitor-based charge pump, which generates a voltage that is approximately the DC input voltage applied to a switch input plus a system supply voltage (e.g., $V_{DD}$).

Charge pumps generally require a periodic clock signal input that allows one or more capacitors to be charged in a first circuit configuration and discharged in a second circuit configuration such that an input voltage is converted to an output voltage at a different potential. The amount of charge current available at the output of a charge pump is generally a function of the frequency of the charge pump clock signal.

Because the gate capacitance of switch NFETs is generally large and internal charge pump capacitors are generally small, it may take many charge pump clock cycles to charge an NFET gate to a sufficient voltage to turn the NFET ON. If a specified switching time requirement is short and the number of charge pump clock cycles needed to turn ON an NFET switch is large, it may be quite difficult (or even impossible) to meet the switching time requirement unless the charge pump frequency is sufficiently high so as to speed up the gate voltage ramp up. However, operating a charge pump at such high frequencies increases the generation of electronic noise, to the detriment of overall system performance.

Accordingly, there is a need for circuits and methods that enable a charge pump to provide sufficient charge to the gate of a switch NFET to turn the NFET ON within a specified switching time requirement but with minimal generation of electronic noise.

SUMMARY

The present invention encompasses circuits and methods that enable a charge pump to provide sufficient charge to the gate of a switch NFET to turn the NFET ON within a specified switching time requirement but with minimal generation of electronic noise.

An embodiment includes a dual-oscillator circuit configured to output from a first oscillator a first frequency signal from a first oscillator during normal operation, and to output from a second oscillator a second frequency signal higher in frequency than the first frequency signal for a selected time determined by a counter.

Another embodiment includes an electronic switch circuit including: a first oscillator having an enable input and an output outputting a first frequency signal; a second oscillator having an enable input and an output outputting a second frequency signal higher in frequency than the first frequency signal; a multiplexor having a first input coupled to the output of the first oscillator, a second input coupled to the output of the second oscillator, a selector input, and an output; a counter, including a clock input coupled to the output of the second oscillator, a count-enable input, a first output coupled to the enable input of the first oscillator, and a second output coupled to the enable input of the second oscillator and to the selector input of the multiplexor; a charge pump coupled to the multiplexor output and configured to output an electrical charge as a function of an applied frequency signal from the multiplexor; a switch having at least one through-path comprising a pair of NFETs having conduction channels coupled in series, each NFET including a gate coupled to the output of the charge pump, each through-path coupling a corresponding input terminal to an output terminal; wherein the counter is configured to assert a control signal on the first output and de-assert a control signal on the second output when not counting, thereby coupling the output of the first oscillator to the output of the multiplexor, and to assert a control signal on the second output during counting, thereby coupling the output of the second oscillator to the output of the multiplexor; wherein the counter commences counting in response to a control signal applied to the count-enable input, the control signal indicating selection of a corresponding through-path and application of a control voltage to the gates of the pair of NFETs of the corresponding through-path; and wherein application of the second frequency signal output during counting increases the amount of electrical charge output by the charge pump.

The details of one or more embodiments of the invention are set forth in the accompanying drawings and the description below. Other features, objects, and advantages of the invention should be apparent from the description and drawings, and from the claims.

DESCRIPTION OF THE DRAWINGS

FIG. 5 is a process flow chart showing one method for switching between two frequencies for application to a charge pump.

Like reference numbers and designations in the various drawings indicate like elements unless the context requires otherwise.

DETAILED DESCRIPTION

The present invention encompasses circuits and methods that enable a charge pump to provide sufficient charge to the gate of a switch NFET to turn the NFET ON within a specified switching time requirement but with minimal generation of electronic noise.

Figure 1:
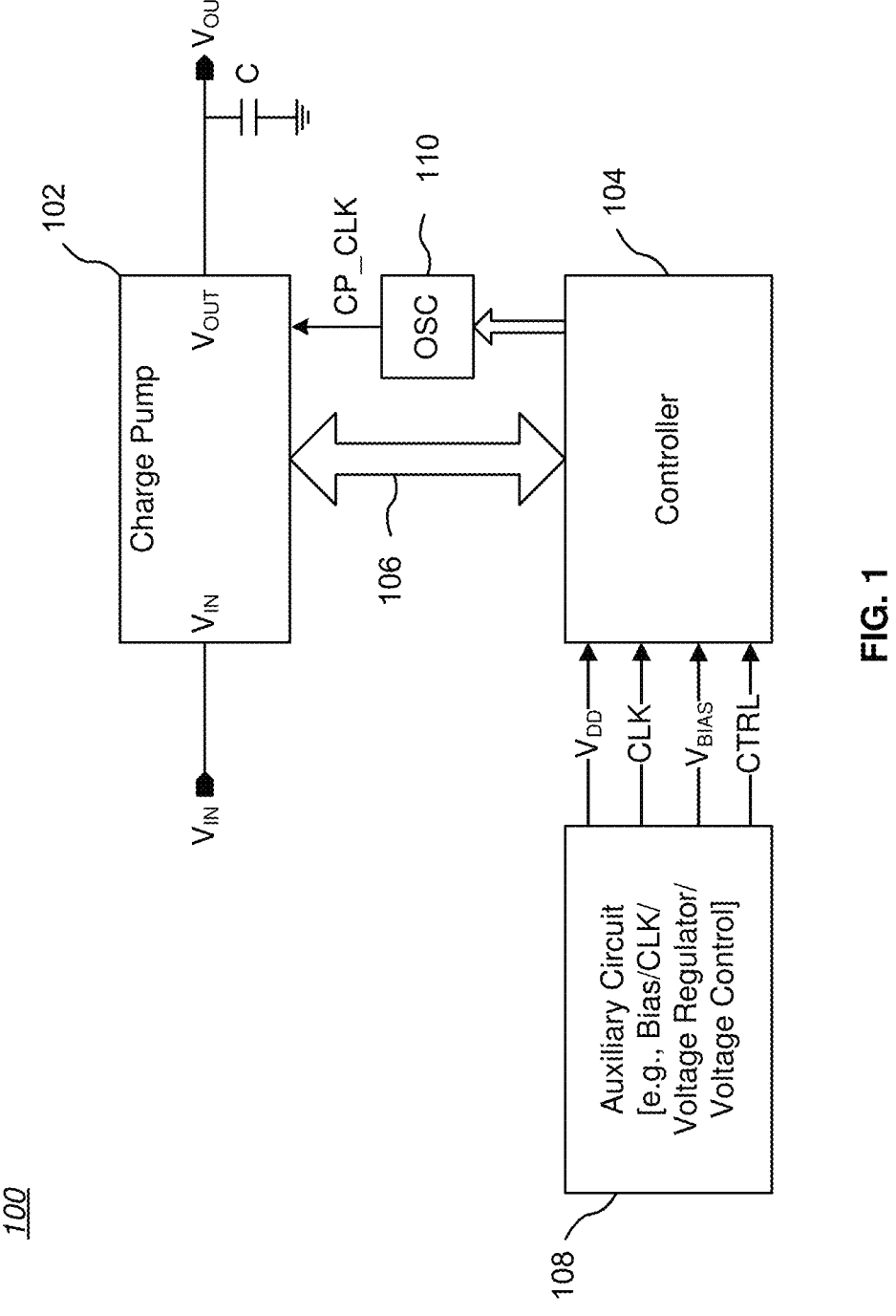
FIG. 1 is a block diagram of an example charge pump circuit.

FIG. 1 is a block diagram of an example charge pump circuit 100. The charge pump circuit 100 includes a charge pump 102 having an input terminal $V_{IN}$ and an output terminal $V_{OUT}$ coupled to a storage capacitor C. The input terminal Vin is configured to be coupled to a voltage source (e.g., a battery) and the output terminal $V_{OUT}$ is configured to be coupled to a load such as the gate of a switch NFET (not shown). Examples of charge pumps include cascade multiplier, Dickson, Ladder, Series-Parallel, Fibonacci, and Doubler switched-capacitor networks. A controller 104 connected to the charge pump 102 by one or more signal lines 106 controls the internal components of the charge pump 102 (e.g., internal switches, such as low voltage FETs, In operation, a DC voltage applied to input terminal $V_{CCA}$ of circuit block 202a is coupled through to the output terminal $V_{CC}$ by turning M1a and M2a ON and M3a OFF; conversely, a voltage applied to input terminal $V_{CCA}$ is blocked from the output terminal $V_{CC}$ by turning M1a and M2a OFF and M3a ON. Circuit block 202b operates in a similar manner: a DC voltage applied to input terminal $V_{CCB}$ is coupled through to the output terminal $V_{CC}$ by turning M1b and M2b ON and M3b OFF; conversely, a voltage applied to input terminal $V_{CCB}$ is blocked from the output terminal $V_{CC}$ by turning M1b and M2b OFF and M3b ON.

The operation of the SPDT switch 200 may be summarized by the following truth table, where CNTL1 and CNTL2 are control signals applied from an external source.

| CNTL1 | CNTL2 | $V_{CCA}$ to $V_{CC}$ | $V_{CCB}$ to $V_{CC}$ | Description |
|---|---|---|---|---|
| Low | Low | shutdown | shutdown | all circuits shut down |
| Low | High | OFF | ON | $V_{CCB}$ to $V_{CC}$ switch path selected |
| High | Low | ON | OFF | $V_{CCA}$ to $V_{CC}$ switch path selected |
| High | High | high isolation | high isolation | Both through-paths OFF but internal circuits powered ON | especially MOSFETs) to cause the charge pump 102 to either boost (increase) or buck (decrease) $V_{IN}$ to $V_{OUT}$. An auxiliary circuit 110 may provide various voltages and/or signals to the controller 104 (and optionally directly to the charge pump 102), such as a voltage $V_{DD}$), a circuit-level clock signal CLK, a circuit bias voltage $V_{BIAS}$, and one or more control signals CTRL. In some embodiments, the circuitry of the auxiliary circuit 108 may be integrated within the controller 104. In some embodiments, the circuitry of the controller 104 (with or without the circuitry of the auxiliary circuit 108) may be integrated within charge pump 102.

In the illustrated example, an oscillator circuit 110 is coupled between the controller 104 and the charge pump 102 and configured to provide a periodic clock signal CP_CLK to the charge pump 102. In some embodiments, the oscillator circuit 110 may be integrated within the controller 104 (with or without the circuitry of the auxiliary circuit 108) or within the charge pump 102.

Figure 2:
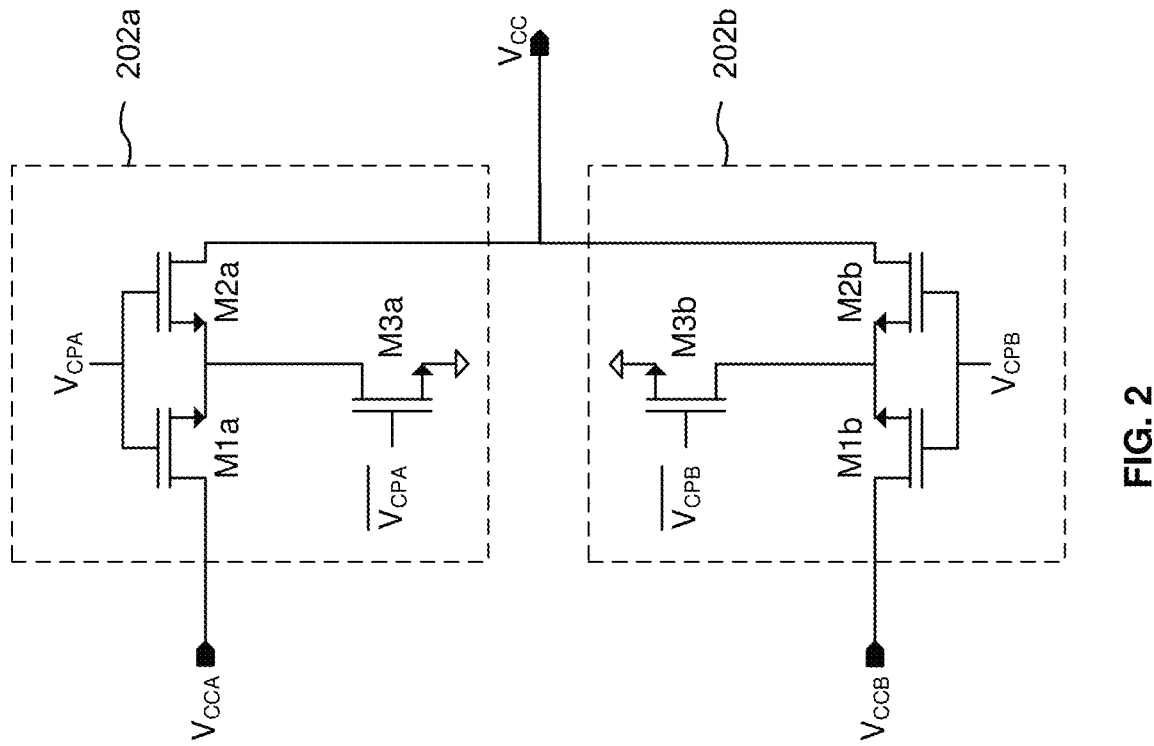
FIG. 2 is a schematic diagram of an example SPDT switch implemented using NFETs.

For context purposes, FIG. 2 is a schematic diagram of an example SPDT switch 200 implemented using NFETs. Circuit block 202a comprises NFETs having a through-path (NFETs M1a and M2a having conduction channels connected in series) between an input terminal $V_{CCA}$ and an output terminal $V_{CC}$, and a shunt path (NFET M3a) between a node between NFETs M1a and M2a and a reference potential, such as circuit ground. The gates of NFETs M1a and M2a are coupled in common to a control voltage $V_{CPA}$, while the gate of NFET M3a is coupled to a complementary control voltage $\overline{V_{CPA}}$. Similarly, circuit block 202b comprises NFETs having a through-path (NFETs M1b and M2b having conduction channels connected in series) between an input terminal $V_{CCB}$ and the output terminal $V_{CC}$, and a shunt path (NFET M3b) between a node between NFETs M1b and M2b and the reference potential. The gates of NFETs M1b and M2b are coupled in common to a control voltage $V_{CPB}$, while the gate of NFET M3b is coupled to a complementary control voltage $\overline{V_{CPB}}$. In some embodiments, in order to withstand applied voltages exceeding the breakdown voltage of a single NFET, one or more of the NFETs may comprise a stack of serially connected NFETs controlled by a common gate signal.

From the nature of NFETs, the gate voltage required to turn an NFET ON must be greater than the voltage applied to the input terminal ($V_{CCA}$ or $V_{CCB}$ in this example). In many applications, a charge pump is used to turn ON the through-path NFETs by adding a voltage above the voltages at the input terminals ($V_{CCA}$ or $V_{CCB}$, depending on which through-path to turn ON). For example, if $V_{CCA}$ is 5V, then a charge pump may add a voltage of about 3-5V to make $V_{CPA}$ be about 8-10V.

In common charge pump designs, a large storage capacitor C is needed if a low charge pump frequency is required at all times, even during through-path switching. The storage capacitor C can be charged during non-switching times to a sufficient voltage level to provide the added voltage needed for through-path NFET switching. A large storage capacitor C is generally external to an integrated circuit (IC) embodying the charge pump circuitry, necessitating at least one additional IC pin and an extra component (the capacitor).

One aspect of the present invention is the recognition that the added voltage provided by a charge pump to turn one or more NFETs ON is only needed during that switching event. It was further recognized that a charge pump may be operated at a high frequency during switching events to produce a boosted voltage sufficient for turning ON the through-path NFETs, but at a low frequency when not switching through-paths. High frequency charge pump operation generates a higher noise level, which may be acceptable in many applications due to the brief switching period; low frequency charge pump operation generates a lower noise level at all other times.

Accordingly, aspects of the present invention encompass circuits and methods that increase the charge pump frequency for a limited number of cycles upon commencement of a through-path switching event to meet a switching time requirement. The inventive circuits and methods eliminate the need for a large external storage capacitor C that would require an extra IC pin.

Figure 3:
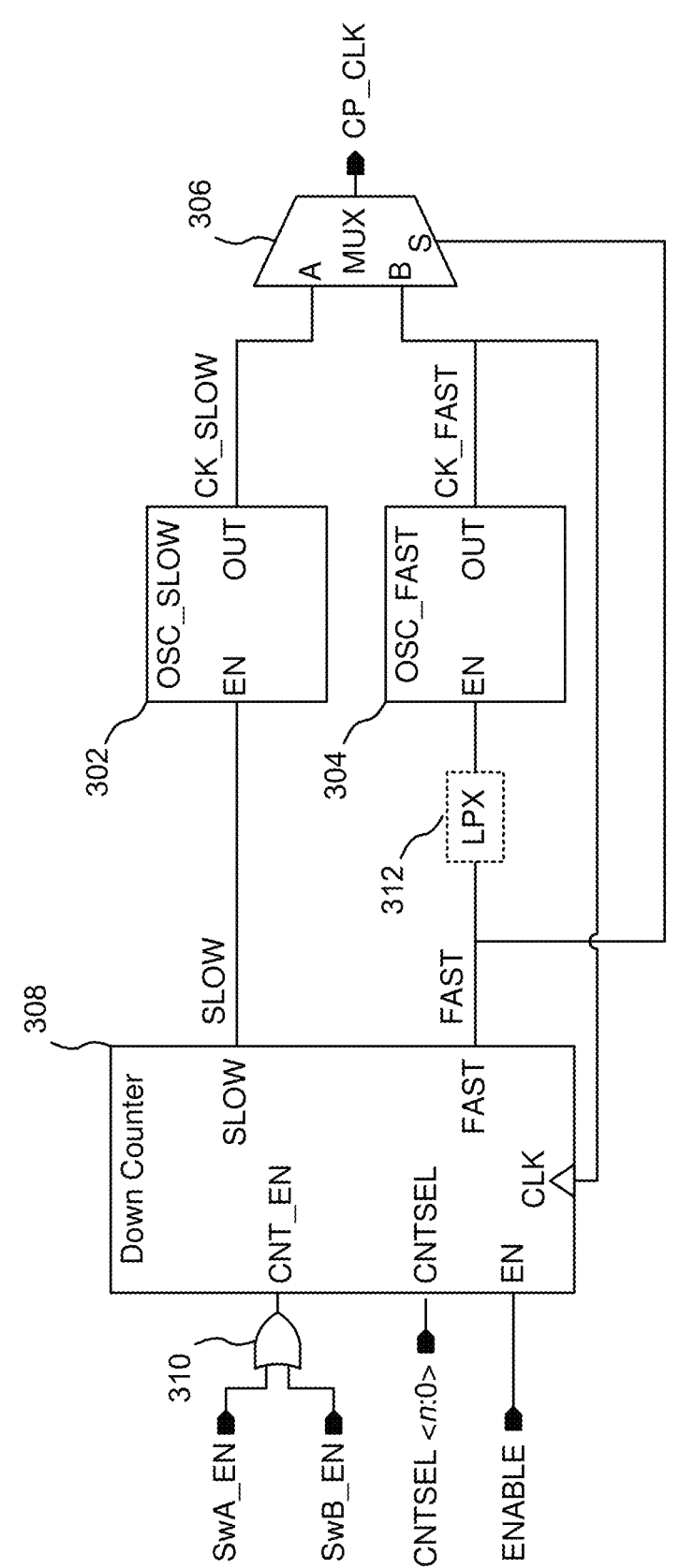
FIG. 3 is a block diagram of a dual-oscillator circuit that may be used as the oscillator circuit of FIG. 1.

FIG. 3 is a block diagram of a dual-oscillator circuit 300 that may be used as the oscillator circuit 110 of FIG. 1. A relatively slow oscillator 302, when enabled, outputs a low frequency (e.g., from about 100 kHz to about 2 MHz) clock signal CK_SLOW. A relatively fast oscillator 304, when enabled, outputs a high frequency (e.g., from about 10 MHz to about 100 MHz) clock signal CK_FAST. Both clock signals, CK_SLOW and CK_FAST, are coupled to respective A and B inputs of a multiplexer (MUX) 306, the output of which is the periodic clock signal CP_CLK applied to the charge pump 102. In some embodiments, the frequency of operation of one or both of the oscillators 302, 304 may be adjustable, such as by application of one or more control signals (not shown), for example, from the controller 104. The oscillators 302, 304 may be of the same design or may be different designs. For example, the slow oscillator 302 may be an LC oscillator circuit or a triangular wave or sawtooth wave oscillator circuit, while the fast oscillator 304 may be a ring oscillator.

A down-counter 308 is configured to output a SLOW control signal coupled to an enable input EN of the slow oscillator 302, and to output a FAST control signal coupled to an enable input EN of the fast oscillator 304 and to a selector input S of the MUX 306. An enable input EN of the down-counter 308 may be coupled, for example, to the controller 104 shown in FIG. 1, which allows the down-counter 308 to be completely enabled or disabled.

The down-counter 308 may be programmable through a count-select CNTSEL input. In the illustrated example, an n-bit count value, where n≥1 (e.g., 6 bits), may be applied to the CNTSEL input. In other embodiments, the count value for the down-counter 308 may be pre-programmed as a fixed number, such as at the time of manufacture of the down-counter 308 circuitry.

A clock input CLK to the down-counter 308 is coupled to the clock signal CK_FAST from the fast oscillator 304. A count-enable input CNT_EN to the down-counter 308 controls triggering of a countdown of a pre-determined number of fast oscillator 304 clock cycles, such as from 48 to zero. In the illustrated example, the CNT_EN is coupled to a two-input OR gate 310. A first input of the OR gate 310 is coupled to a control signal, SwA_EN, which signals that a first through-path has been enabled (e.g., the through-path of circuit block 202a), such as by the controller 104. A second input of the OR gate 310 is coupled to a control signal, SwB_EN, which signals that a second through-path has been enabled (e.g., the through-path of circuit block 202b), such as by the controller 104. In some embodiments, the OR function provided by the OR gate 310 may be integrated within the down-counter 308; thus, the down-counter 308 would have two CNT_EN inputs, one for SwA_EN and one for SwB_EN.

In non-switching operation, the SLOW output of the down-counter 308 is asserted to an ON state (e.g., a logic "1"), thus enabling the slow oscillator 302, and the FAST output of the down-counter 308 is de-asserted to an OFF state (e.g., a logic "0"), thus disabling the fast oscillator 304 and setting the MUX 306 to select input A (CL_SLOW) to output as CP_CLK to the charge pump 102.

Immediately after a through-path of a circuit block 202a, 202b is turned ON (as indicated by a respective control signal, SwA_EN, SwB_EN), the FAST output of the down-counter 308 is set to ON, thereby enabling the fast oscillator 304 and concurrently setting the MUX 306 to select input B (CL_FAST) to output as CP_CLK to the charge pump 102. The SLOW output of the down-counter 308 may remain ON (since its output is no longer passed through the MUX 306) or may be turned OFF (e.g., to save power usage in the slow oscillator 302). Thus, initiating turning ON a through-path of a circuit block 202a, 202b results in a fast clock signal to the charge pump 102, enabling the charge pump to more rapidly generate the charge and voltage needed to switch the selected through-path NFETs to an ON state.

The enabled down-counter 308, driven by the CK_FAST clock signal from the fast oscillator 304 applied to the CLK clock input, starts counting down a pre-determined number of clock cycles equal to the n-bit value applied to the count-select CNTSEL input (or to the pre-programmed fixed numeric value in some embodiments). For example, if the CNTSEL input is "48", the down-counter 308 will turn ON the FAST output for 48 cycles of the CK_FAST clock signal. After the countdown reaches zero, the FAST output will turn OFF and the MUX 306 will revert to outputting the CK_SLOW clock signal as CP_CLK to the charge pump 102. Importantly, the fast oscillator 304 will be disabled, thus reducing any noise that might have been generated by the fast oscillator 304 while enabled.

As should be clear, the function of the down-counter 308 in temporarily enabling the fast oscillator 304 for a specified number of fast clock cycles may be implemented by a suitably configured up-counter. Other alternative circuits for temporarily enabling the fast oscillator 304 for a specified number of fast clock cycles include an RC delay circuit and comparator-based delay circuits. Accordingly, the term "counter" as used in this disclosure should be deemed to encompass any circuit that can temporarily enable the fast oscillator 304 for a specified number of fast clock cycles.

The pre-determined number of fast clock cycles set in the down-counter 308 for enabling the fast oscillator 304 is designed to last no more than the maximum switching time specification for the switch NFETs. Accordingly, a fixed number may be determined (e.g., by modeling, analysis, or experimentation) for the pre-determined number of clock cycles. Alternatively, the number of fast clock cycles may vary if the number is guaranteed to end within the switching time specification. For example, it may be that the number of fast clock cycles is dependent on circuit temperature or charge pump frequency, such that a lower number of fast clock cycles may be sufficient under a first set of conditions and a higher number of fast clock cycles may be needed under a second set of conditions. The conditions may be determined, for example, by the controller 104 and set by the n-bit count value applied to the CNTSEL input of the down-counter 308. As another alternative, the number of fast clock cycles may be set to last for a maximum duration just slightly less than a switching time specification; the lower on-resistance of the through FET switches can be achieved sooner, as the $V_{GS}$ of the switch FET will be higher sooner than otherwise.

In some embodiments of the fast oscillator 304 (e.g., a ring oscillator), it may be useful or necessary to insert an optional low-pulse extender circuit 312 between the FAST output of the down-counter 308 and the enable input EN of the fast oscillator 304 to make sure that disabling the fast oscillator 304 does not cause an oscillator stability issue. A pulse extender circuit (also known as a pulse stretcher circuit) selectively prolongs certain pulses (e.g., low pulses) but does not extend other pulses (e.g., high pulses). Thus, when the FAST output of the down-counter 308 transitions from ON (high pulse) to OFF (low pulse), the low-pulse extender circuit 312 causes the low pulse to be prolonged for a time sufficient for the fast oscillator 304 to reach a stable disabled state. Accordingly, the fast oscillator 304 will be blocked from being re-enabled too quickly by assertion of the FAST output too quickly after a countdown has ended in the down-counter 308.

While the examples of this disclosure have involved SPDT switches, the concepts are readily extendable to switch configurations having more than two input terminals and more than one output terminal (e.g., matrix switches).

Circuit Embodiments

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit components or blocks (e.g., filters, amplifiers, passive components, and possibly additional ICs) into one package. The ICs and/or modules are then typically combined with other components, often on a printed circuit board, to form part of an end-product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

Figure 4:
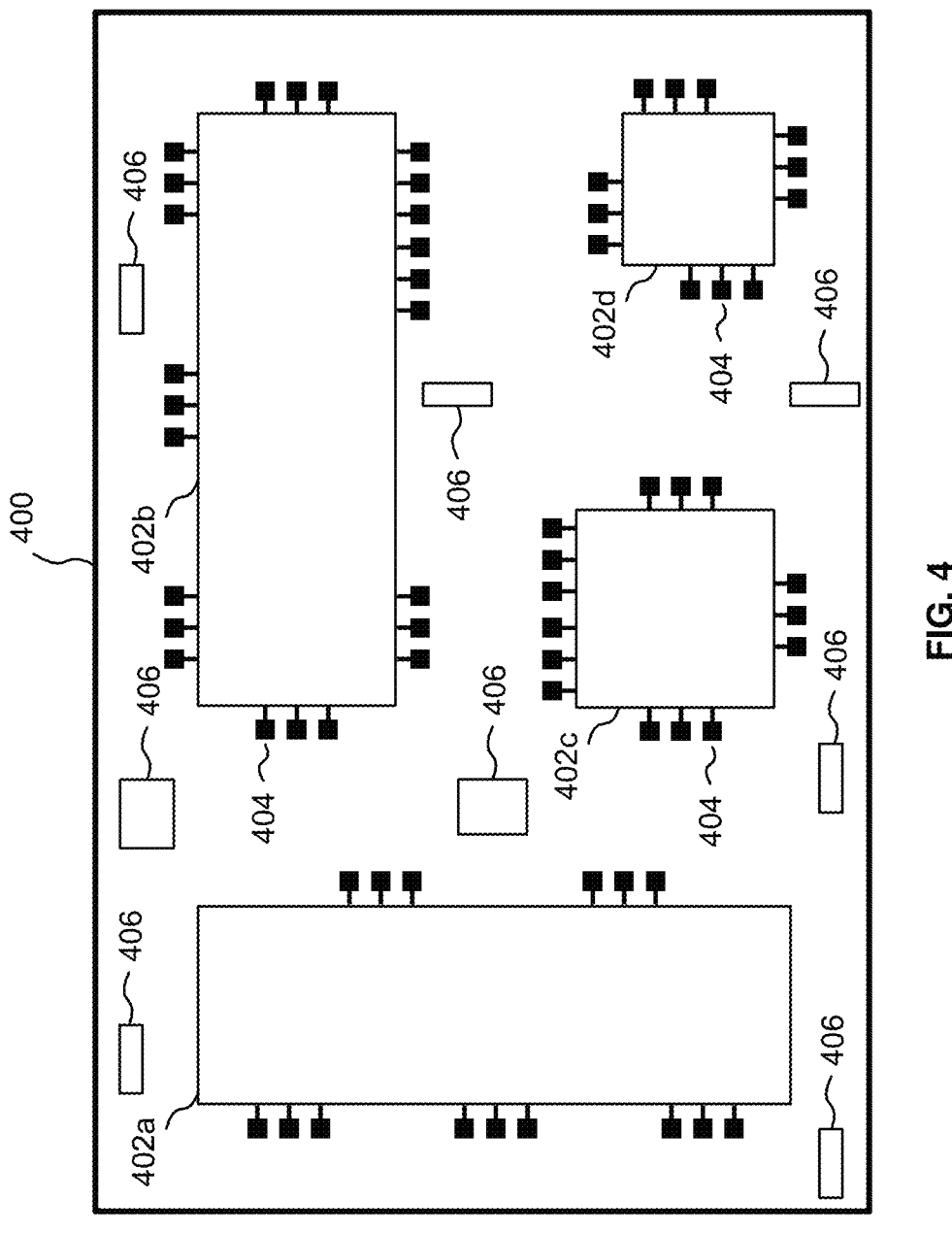
FIG. 4 is a top plan view of a substrate that may be, for example, a printed circuit board or chip module substrate (e.g., a thin-film tile).

As one example of further integration of embodiments of the present invention with other components, FIG. 4 is a top plan view of a substrate 400 that may be, for example, a printed circuit board or chip module substrate (e.g., a thin-film tile). In the illustrated example, the substrate 400 includes multiple ICs 402a-402d having terminal pads 404 which would be interconnected by conductive vias and/or traces on and/or within the substrate 400 or on the opposite (back) surface of the substrate 400 (to avoid clutter, the surface conductive traces are not shown and not all terminal pads are labelled). The ICs 402a-402d may embody, for example, signal switches, active and/or passive filters, amplifiers (including one or more LNAs), and other circuitry. For example, IC 402b may incorporate one or more instances of a charge pump circuit 100 that includes a dual-oscillator circuit 300.

The substrate 400 may also include one or more passive devices 406 embedded in, formed on, and/or affixed to the substrate 400. While shown as generic rectangles, the passive devices 406 may be, for example, filters, capacitors, inductors, transmission lines, resistors, antennae elements, transducers (including, for example, MEMS-based transducers, such as accelerometers, gyroscopes, microphones, pressure sensors, etc.), batteries, etc., interconnected by conductive traces on or in the substrate 400 to other passive devices 406 and/or the individual ICs 402a-402d. The front or back surface of the substrate 400 may be used as a location for the formation of other structures.

System Aspects

Embodiments of the present invention are useful in a wide variety of larger radio frequency (RF) circuits and systems for performing a range of functions, including (but not limited to) impedance matching circuits, RF power amplifiers, RF low-noise amplifiers (LNAs), phase shifters, attenuators, antenna beam-steering systems, charge pump devices, RF switches, etc. Such functions are useful in a variety of applications, such as radar systems (including phased array and automotive radar systems), radio systems (including cellular radio systems), and test equipment.

Radio system usage includes wireless RF systems (including base stations, relay stations, and hand-held transceivers) that use various technologies and protocols, including various types of orthogonal frequency-division multiplexing ("OFDM"), quadrature amplitude modulation ("QAM"), Code-Division Multiple Access ("CDMA"), Time-Division Multiple Access ("TDMA"), Wide Band Code Division Multiple Access ("W-CDMA"), Global System for Mobile Communications ("GSM"), Long Term Evolution ("LTE"), 5G, 6G, and WiFi (e.g., 802.11a, b, g, ac, ax, be) protocols, as well as other radio communication standards and protocols.

Methods

Another aspect of the invention includes methods for selecting between a slow oscillator and a fast oscillator as a clock source, such as for a charge pump. For example, FIG. 5 is a process flow chart 500 showing one method for switching between two frequencies for application to a charge pump. The method includes: coupling an output of a first oscillator to the charge pump during normal operation of the charge pump, the first oscillator outputting a first frequency signal (Block 502); and coupling an output of a second oscillator to the charge pump during a period of time defined by a counter, the second oscillator outputting a second frequency signal higher in frequency than the first frequency signal (Block 504).

Additional aspects of the above method may include one or more of the following: wherein the counter commences counting in response to a control signal applied to the counter; wherein the counter commences counting in response to either a first control signal or a second control signal applied to the counter; and/or wherein the charge pump outputs an electrical charge as a function of an applied frequency signal, and wherein application of the second frequency signal during counting increases the amount of electrical charge output by the charge pump.

Fabrication Technologies & Options

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

With respect to the figures referenced in this disclosure, the dimensions for the various elements are not to scale; some dimensions may be greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOS- FET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies, such as bipolar junction transistors (BJTs), BiCMOS, LDMOS, BCD, GaAs HBT, GaN HEMT, GaAs pHEMT, MESFET, InP HBT, InP HEMT, FinFET, GAAFET, and SiC-based device technologies, using 2-D, 2.5-D, and 3-D structures. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A dual-oscillator circuit, comprising:
an output circuit configured to provide an output;
a first oscillator configured to provide a first frequency signal having a first frequency to the output circuit;

a second oscillator configured to provide a second frequency signal having a second frequency to the output circuit, wherein the second frequency is greater than the first frequency; and
a counter coupled to the output circuit and configured to generate one or more enable signals having a state enabling the output circuit to provide either the first frequency signal or the second frequency signal as the output.

2. The dual-oscillator circuit of claim 1, wherein the counter is configured to commence counting in response to a control signal applied to the counter, and wherein the counter is configured to generate enable signals that enable the output circuit to provide the second frequency signal as the output if counting.

3. The dual-oscillator circuit of claim 1, wherein the counter is configured to commence counting in response to either a first control signal or a second control signal applied to the counter, and wherein the counter is configured to generate enable signals that enable the output circuit to provide the second frequency signal as the output if counting.

4. A system, comprising:
the dual-oscillator circuit of claim 1; and
a charge pump having an output node, and configured to output an electrical charge at the output node of the charge pump, wherein the electrical charge is based on the output of the output circuit, wherein the electrical charge is greater if the output of the output circuit is the second frequency signal than if the output of the output circuit is the first frequency signal,
wherein the counter is configured to change a count value from an initial value to a final value according to a received clock signal, and wherein the counter is configured to generate enable signals that enable the output circuit to provide the second frequency signal as the output of the output circuit if changing the count value.

5. The dual-oscillator circuit of claim 4, further including a switch having at least one through-path comprising a pair of NFETs having conduction channels coupled in series, each NFET including a gate coupled to the output node of the charge pump, each through-path coupling a corresponding input terminal to an output terminal.

6. The dual-oscillator circuit of claim 1, wherein the counter is configured to conditionally change a count value from an initial value in response to a received clock signal, and is configured to generate the one or more enable signals based on whether the count value is being changed.

7. The dual-oscillator circuit of claim 1, wherein the counter is configured to enable the second oscillator for a specified number of clock cycles of the second oscillator.

8. A dual-oscillator circuit including:
a first oscillator having an enable input and an output configured to output a first frequency signal;
a second oscillator having an enable input and an output configured to output a second frequency signal higher in frequency than the first frequency signal;
a multiplexor having a first input coupled to the output of the first oscillator, a second input coupled to the output of the second oscillator, a selector input, and an output; and
a counter, including:
a clock input coupled to the output of the second oscillator;
a count-enable input;
a first output coupled to the enable input of the first oscillator;

a second output coupled to the enable input of the second oscillator and to the selector input of the multiplexor;

wherein the counter is configured to assert a first enable signal on the first output and de-assert a second enable signal on the second output if not counting to couple the first frequency signal to the output of the multiplexor, and to assert the second enable signal on the second output if counting to couple the second frequency signal to the output of the multiplexor.

9. The dual-oscillator circuit of claim 8, wherein the counter is configured to commence counting in response to a control signal applied to the count-enable input.

10. The dual-oscillator circuit of claim 8, wherein the counter is configured to commence counting in response to either a first control signal applied to the count-enable input or a second control signal applied to the count-enable input.

11. A system, comprising:

the dual-oscillator circuit of claim 6; and a charge pump having an output node, and configured to output an electrical charge at the output node of the charge pump, wherein the electrical charge is based on the signal coupled to the output of the multiplexor, wherein the electrical charge is greater if the output of the multiplexor is coupled to the second frequency signal than if the output of the multiplexor is coupled to the first frequency signal, wherein the counter is configured to change a count value from an initial value to a final value according to a received clock signal, and wherein the counter is configured to generate enable signals that enable the multiplexor to couple the second frequency signal to the output of the multiplexor if changing the count value.

12. The dual-oscillator circuit of claim 11, further including a switch having at least one through-path comprising a pair of NFETs having conduction channels coupled in series, each NFET including a gate coupled to the output node of the charge pump, each through-path coupling a corresponding input terminal to an output terminal.

13. The dual-oscillator circuit of claim 12, wherein the counter is configured to commence counting in response to a control signal applied to the count-enable input, the control signal indicating selection of a corresponding through-path and indicating application of a control voltage to the gates of the pair of NFETs.

14. The dual-oscillator circuit of claim 12, wherein the counter is configured to commence counting in response to either a first control signal applied to the count-enable input or a second control signal applied to the count-enable input, the first control signal and the second control signal each indicating selection of a corresponding through-path and indicating application of a control voltage to the gates of the pair of NFETs of the corresponding through-path.

15. The dual-oscillator circuit of claim 8, further including a low-pulse extender circuit coupled between the second output of the counter and the enable input of the second oscillator.

16. The dual-oscillator circuit of claim 8, wherein the counter is a down-counter.

17. The dual-oscillator circuit of claim 8, wherein the counter includes a count select input configured to receive an n-bit count value, where $n \geq 1$, that determines a duration of the counting of the counter.

18. An electronic switch circuit including:

a first oscillator having an enable input and an output configured to output a first frequency signal;

a second oscillator having an enable input and an output configured to output a second frequency signal higher in frequency than the first frequency signal;

a multiplexor having a first input coupled to the output of the first oscillator, a second input coupled to the output of the second oscillator, a selector input, and an output;

a counter, including:

a clock input coupled to the output of the second oscillator;

a count-enable input;

a first output coupled to the enable input of the first oscillator;

a second output coupled to the enable input of the second oscillator and to the selector input of the multiplexor;

a charge pump coupled to the multiplexor output, the charge pump having an output node, and configured to output an electrical charge at the output node of the charge pump, wherein the electrical charge is based on the signal coupled to the output of the multiplexor, wherein the electrical charge is greater if the output of the multiplexor is coupled to the second frequency signal than if the output of the multiplexor is coupled to the first frequency signal, a switch having at least one through-path comprising a pair of NFETs having conduction channels coupled in series, each NFET including a gate coupled to the output of the charge pump, each through-path coupling a corresponding input terminal to an output terminal;

wherein the counter is configured to assert a first enable signal on the first output and de-assert a second enable signal on the second output if not counting to couple the first frequency signal to the output of the multiplexor, and to assert a control the second enable signal on the second output if counting to couple the second frequency signal to the output of the multiplexor; and wherein the counter is configured to commence counting in response to a control signal applied to the count-enable input, the control signal indicating selection of a corresponding through-path and indicating application of a control voltage to the gates of the pair of NFETs of the corresponding through-path.

19. The electronic switch circuit of claim 18, wherein the counter is configured to commence counting in response to either a first control signal applied to the count-enable input or a second control signal applied to the count-enable input, the first control signal and the second control signal each indicating selection of a corresponding through-path and indicating application of a control voltage to the gates of the pair of NFETs of the corresponding through-path.

20. The electronic switch circuit of claim 18, further including a low-pulse extender circuit coupled between the second output of the counter and the enable input of the second oscillator.

21. The electronic switch circuit of claim 18, wherein the counter is a down-counter.

22. The electronic switch circuit of claim 18, wherein the counter includes a count select input configured to receive an n-bit count value, where $n \geq 1$, that determines a duration of counting by the counter.

* * * * *